United States Patent [19]

Sandhu

[11] Patent Number: 5,438,019
[45] Date of Patent: Aug. 1, 1995

[54] LARGE AREA THIN FILM GROWING METHOD

[75] Inventor: Gurtej S. Sandhu, Boise, Id.

[73] Assignee: Micron Semiconductor, Inc., Boise, Id.

[21] Appl. No.: 273,291

[22] Filed: Jul. 11, 1994

[51] Int. Cl.⁶ .......................................... H01L 21/205
[52] U.S. Cl. .................................... 437/101; 437/103; 437/109; 437/233; 437/967; 427/255.1
[58] Field of Search ............... 437/101, 233, 109, 103, 437/967; 136/258 PC, 258 AM; 427/255.1, 255

[56] References Cited

U.S. PATENT DOCUMENTS

| | | | |
|---|---|---|---|
| 4,363,828 | 12/1982 | Brodsky et al. | 437/101 |
| 4,459,163 | 7/1984 | MacDiarmid et al. | 437/233 |
| 4,683,144 | 7/1987 | Nishimura et al. | 136/258 AM |
| 4,683,145 | 7/1987 | Nishimura et al. | 136/258 AM |
| 5,013,690 | 5/1991 | Hochberg et al. | 437/233 |
| 5,064,779 | 11/1991 | Hasegawa | 437/233 |
| 5,194,398 | 3/1993 | Miyachi et al. | 437/101 |
| 5,246,744 | 9/1993 | Matsuda et al. | 136/258 AM |

FOREIGN PATENT DOCUMENTS

| | | | |
|---|---|---|---|
| 61-88520 | 5/1986 | Japan | 437/233 |
| 63-155610 | 6/1988 | Japan | 427/255.1 |
| 3-250624 | 11/1991 | Japan | 437/233 |

OTHER PUBLICATIONS

Kurtz et al, "Chemical Vapor Deposition of Hydrogenated Amorphous Silicon", J. Appl. Phys., vol. 59, No. 1, 1 Jan. 1986, pp. 249–256.

Hirose, "A-Si:H Deposition from Higher Silanes", JARECT vol. 16 Amorphous Semiconductor Technologies & Devices (1984), pp. 67–79.

Manfredotti, "Amorphous Silicon Prepared by Low Pressure Chemical Vapor Deposition", Thin Solid Films, vol. 141, Aug. 1986, pp. 171–178.

Hirose, "Chemical Vapor Deposition", Semiconductors and Semimetals, vol. 21A, Hydrogenated A-Si, Academic Press, 1984, pp. 109–122.

Surface Science V. 195, pp. 307–329 (1988) Stephen M. Gates, Adsorption Kinetics of SiH4 . . . On The Si (111)-(7×7) Surface.

S. M. Gates et al. Decomposition Of Silane And Si Surfaces Below 500° C. J. Chem. Phys 92(5) pp. 3144–3152 (1 Mar. 1990).

R. Tsu et al. Adsorption And Dissociation Of $Si_2H_6$ on Ge, Surface Science v. 280, pp. 265–276, (1993).

*Primary Examiner*—Mary Wilczewski
*Attorney, Agent, or Firm*—Henri J. A. Charmasson; John D. Buchaca

[57] ABSTRACT

High quality silicon thin films are formed on a substrate in a conventional chemical vapor deposition reactor using silicon hydride source gas, and allowing adsorption of the deposition at low temperature before decomposition at a higher temperature. The silicon source gas comprises a mixture of silane and polysilanes exhibiting different coefficients of adsorption in order to achieve a uniform growth of successive thin films.

7 Claims, 1 Drawing Sheet

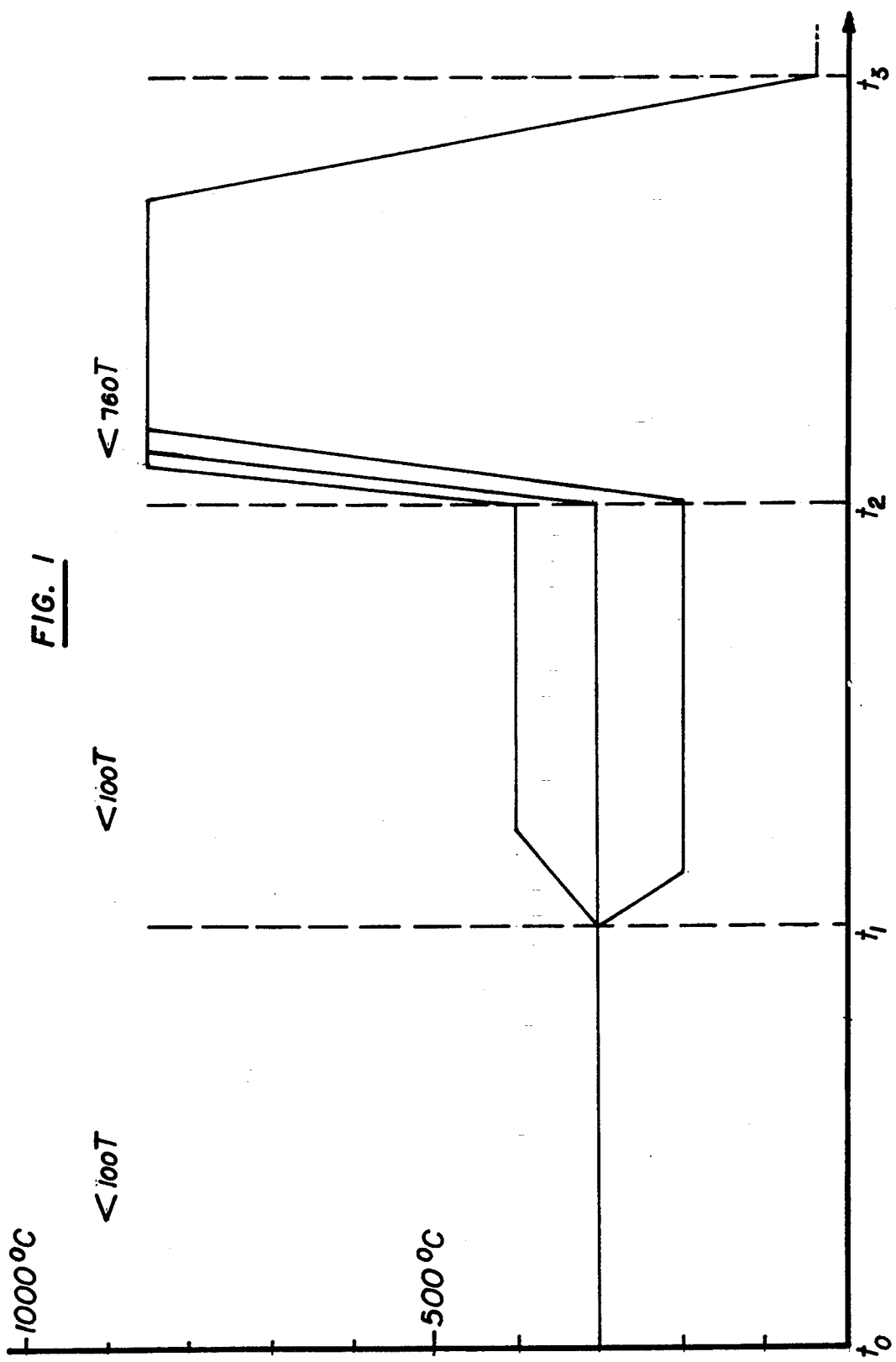

LARGE AREA THIN FILM GROWING METHOD

FIELD OF THE INVENTION

This invention relates to the fabrication of microelectronic circuits, and more specifically to the formation of thin films by chemical vapor deposition (CVD) methods.

BACKGROUND OF THE INVENTION

The formation of high quality thin silicon (Si) films constitute an integral part of micro-circuit manufacture. Thin Si films are used to form gate structures of thin film transistors, the cell dielectric of dynamic random access memory (DRAM), and other conductive and non-conductive micro-structures.

The most effective, but also the most expensive and slowest method for depositing very thin defect-free films is molecular beam apitaxy (MBE), wherein layer-by-layer growth is accomplished under ultra-high vacuum.

Thin Si films are most commonly, and most inexpensively formed by CVD through the reaction of hydrogen with silicon tetrachloride ($SiCl_4$), or through the deposition of silane ($SiH_4$) followed by a pyrolitic decomposition into Si and $H_2$.

The thinness of reliable film achievable through such a process is limited by the defect density (pinholes) and deformity resulting from the uneven formation, inherent to the CVD process, of scattered islands at low energy sites on the substrate, followed by a growth and merging of these islands into a continuous layer.

This invention results from efforts to improve the quality of CVD thin films. It is based on previous observations that, compared to silane, higher order silicon hydrides ($Si_nH_{2n+2}$ where $n>1$) or polysilanes exhibit several orders of magnitude higher sticking probabilities on Si than silane, and lower decomposition temperatures; and that disilane ($Si_2H_6$) adsorption at room temperature occurs at random distribution of sites which are not correlated with defects of steps (Stephen M. Gates, Adsorption Kinetics of SiH4 . . . on the Si(111)-(7X7) Surface, Surface Science v.195, p.307-329 (1988); S. M. Gates et al. Decomposition of Silane and Si surfaces below 500° C. J. Chem. Phys 92(5) p.3144-3152 (1 Mar. 1990); R. Tsu et al. Adsorption and Dissociation of $Si_2H_6$ on Ge, Surface Science v.280, p.265-276, (1993)).

SUMMARY OF THE INVENTION

The principal and secondary objects of this invention are to provide an improved process for forming high quality thin films on microelectronic silicon substrates using conventional chemical vapor deposition procedures without any need for ultra high vacuum or high temperature environment.

These and other valuable objects are achieved by the deposition and the composition of a polysilane to form layer-by-layer film growth in a conventional rapid thermal or low pressure chemical vapor deposition reactor, through uniform but limited supply of a silicon source at the substrate surface.

The process requires a careful control of the amount of silicon source gases available at the substrate surface in order to deposit a series of thin, but continuous and uniform layers of silicon. On one hand, the amount of silicon source gases must be adequate to be adsorbed uniformly over the entire surface of the substrate. On the other hand, the amount of source gases must be limited to prevent spontaneous nucleation and growth at scattered sites. Furthermore, in order to achieve deposition, one must avoid complete de-adsorption of the silicon source gases as the temperature of the substrate is raised. The pressure of the gases must, therefore, be optimized to achieve the desired balance between adsorption and de-adsorption, i.e. emission rates of the gases into and out of the substrate. To that end a number of source gases having different adsorption coefficients at a given temperature are combined. The instant invention teaches the use of a mixture of silane with disilane and other polysilanes. These gases, not only exhibit adsorption coefficients that differ by an order of magnitude at a given temperature, but have also different rates of change of adsorption. These two characteristics contribute to the uniform growth of successive layers of continuous silicon films.

BRIEF DESCRIPTION OF THE DRAWING

FIG. 1 is a temperature vs. time diagram of the deposition process.

DESCRIPTION OF THE PREFERRED EMBODIMENT OF THE INVENTION

A silicon substrate is placed inside a conventional rapid thermal or low pressure chemical vapor deposition reactor.

A gaseous phase of argon combined with silane and at least one type of polysilane ($Si_nH_{2n+2}$ where $n>1$) is admitted into the chamber under a pressure of less than 100 Torr, and allowed to deposit on the substrate at a temperature from 0° to 500° C. The remaining reactant gas is evacuated by flowing in either, argon, a mixture of argon and hydrogen, or a mixture of argon and silane or a polysilane. In said mixture the silicon source may be diluted down to a range between 99 to 0.1 percent with argon, hydrogen, or another noble gas. The substrate is then heated by lamp or laser to a temperature between up to 1,000° C. under a pressure between 1 mTorr and 760 Torrs, in order to trigger a decomposition of the polysilane into Si and $H_2$. The process is successively and sequentially repeated to grow a thicker, but uniform layer of silicon upon the substrate.

It should be noted that the remaining reactant gases could, in certain cases, be only partially evacuated since the presence of a small amount of silicon source gases is preferred during the heating phase.

An entire examplary process is illustrated in the diagram of FIG. 1. In this case, the deposit phase ($t_0-t_1$) is accomplished under a temperature of 300° C. The evacuation phase ($t_1-t_2$) is shown done under three different temperatures (200° C., 300° C. and 400° C.). This evacuation phase is conducted under the same low pressure as the first phase. The third phase ($t_2-t_3$) is preferably done under a temperature close to 900° C. and a pressure close to, but not exceeding 760 Torrs.

Each phase lasts approximately 5 to 20 seconds. The second and third phases are done in the presence of the evacuating gas or mixture consisting of argon, or argon and highly diluted silane or polysilane.

The successive deposition, adsorption and decomposition steps are controlled by repeatedly pulsing the gas-admitting valve and the substrate heater at a steady rate of up to twenty seconds per step.

While the preferred embodiment of the invention has been described, modifications can be made and other embodiments may be devised without departing from the spirit of the invention and the scope of the appended claims.

What is claimed is:

1. A process for forming a uniform Si thin film on a substrate in a conventional chemical vapor deposition reactor, which comprises the steps of:

admitting a gaseous phase of a noble gas combined with a plurality of silicon source gases having different adsorption coefficients at a given temperature, during a first period of time;

allowing uniform adsorption on said substrate under a constant temperature, for a second period of time;

evacuating at least a portion of said silicon source gases;

heating said substrate, for a third period of time; and repeating said admitting, allowing, and heating until a desired number of successive layers of silicon have been deposited over said substrate, wherein said noble gas comprises argon, and said silicon source gases are selected from the group consisting of silane, disilane, and other polysilanes; and wherein:

said admitting, allowing and evacuating are conducted under a pressure of less than 100 Torrs, and a temperature between 0° C. and 500° C.; and said heating comprises heating said substrate to a temperature up to 1000° C. under pressure of up to 760 Torrs.

2. The process of claim 1, wherein said periods of time each ranges from 5 to 10 seconds.

3. The process of claim 2, wherein said repeating comprises pulsing a gas-admitting means and a substrate-heating means at a rate of up to 20 seconds per step.

4. The process of claim 1, wherein said evacuating comprises flowing into said reactor, a mixture of a noble gas or hydrogen and at least one silicon source gas selected from the group consisting of silane, disilane, and other polysilanes.

5. The process of claim 4, wherein:

said noble gas is selected from the group consisting of argon and helium; and said mixture comprises a percentage of 0.01 to 99.00 of said silicon source gas.

6. A process for forming a uniform Si thin film on a substrate in a conventional chemical vapor deposition reactor, which comprises the steps of:

admitting a gaseous phase of a noble gas combined with a plurality of silicon source gases having different adsorption coefficients at a given temperature, during a first period of time;

allowing uniform adsorption on said substrate under a constant temperature, for a second period of time;

evacuating at least a portion of said silicon source gases;

heating said substrate, for a third period of time; and repeating said admitting, allowing, and heating until a desired number of successive layers of silicon have been deposited over said substrate;

wherein said silicon source gases are selected from the group consisting of silane, disilane, and other polysilanes; and wherein:

said admitting, allowing and evacuating are conducted under a pressure of less than 100 Torrs, and a temperature between 0° C. and 500° C.; and said heating comprises heating said substrate to a temperature up to 1000° C. under pressure of up to 760 Torrs.

7. A process for forming a uniform Si thin film on a substrate in a conventional chemical vapor deposition reactor, which comprises the steps of:

admitting a gaseous mixture comprising a diluting gas and a plurality of silicon source gases having different adsorption coefficients at a given temperature, during a first period of time;

allowing uniform adsorption on said substrate under a constant temperature, for a second period of time;

evacuating at least a portion of said silicon source gases;

heating said substrate, for a third period of time; and repeating said admitting, allowing, and heating until a desired number of successive layers of silicon have been deposited over said substrate;

wherein said diluting gas is chosen from the group consisting of a noble gas and hydrogen and said silicon source gases are selected from the group consisting of silane, disilane, and other polysilanes; and wherein:

said admitting, allowing and evacuating are conducted under a pressure of less than 100 Torrs, and a temperature between 0° C. and 500° C.; and said heating comprises heating said substrate to a temperature up to 1000° C. under pressure of up to 760 Torrs.

* * * * *